US006461932B1

(12) United States Patent
Wang (10) Patent No.: US 6,461,932 B1
(45) Date of Patent: Oct. 8, 2002

(54) SEMICONDUCTOR TRENCH ISOLATION PROCESS THAT UTILIZES SMOOTHENING LAYER

(75) Inventor: Fu-Cheng Wang, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/211,703

(22) Filed: Dec. 14, 1998

(51) Int. Cl.$^7$ .......................... H01L 21/336; H01L 21/76
(52) U.S. Cl. ...................... 438/400; 438/296; 438/424; 438/427
(58) Field of Search .................... 438/296, 460, 438/424, 427, 416, 431, 434, 428

(56) References Cited

U.S. PATENT DOCUMENTS

| | | | | |
|---|---|---|---|---|
| 5,294,562 A | * | 3/1994 | Lur et al. | 437/67 |
| 5,387,539 A | * | 2/1995 | Yang et al. | 437/67 |
| 5,498,565 A | * | 3/1996 | Gocho et al. | 437/67 |
| 5,595,927 A | * | 1/1997 | Chen et al. | 437/52 |
| 5,691,215 A | * | 11/1997 | Dai et al. | 437/44 |
| 5,698,473 A | * | 12/1997 | Ibok et al. | 437/240 |
| 5,710,076 A | * | 1/1998 | Dai et al. | 438/305 |
| 5,728,621 A | * | 3/1998 | Zheng et al. | 438/427 |
| 5,874,345 A | * | 2/1999 | Coronel et al. | 438/427 |
| 6,004,893 A | * | 12/1999 | Jang | 438/427 |

OTHER PUBLICATIONS

Chiu et al, "CMP of Low k SOG/SOP," *Tech. Dig., 1998 CMP–MIC Conf.*, Feb. 19–20, 1998, pp. 328–335.
Detzel et al, "Comparison of the Performance of Slurries for STI Processing," *Tech. Dig., 1997 CMP–MIC Conf.*, Feb. 13–14, 1997, pp. 202–206.
Fury, "The early days of CMP," *Solid State Tech.*, May 1997, pp. 81–86.
Grillaert et al, "A novel approach for the elimination of the pattern density dependence of CMP for shallow trench isolation," *Tech. Dig., 1998 CMP–MIC Conf.*, Feb. 19–20, 1998, pp. 313–318.

Hosali et al, "Planarization Process and Consumable Development for Shallow Trench Isolation," *Tech. Dig., 1997 CMP–MIC Conf.*, Feb. 13–14, 1997, pp. 52–57.
Mills et al, "Raising Oxide:Nitride Selectivity to Aid in the CMP of Shallow Trench Isolation Type Applications," *Tech. Dig., 1997 CMP–MIC Conf.*, Feb. 13–14, 1997, pp. 179–185.
Perry, "Chemical Mechanical Polishing: The Impact of a New Technology on an Industry," *1998 Symposium on VLSI Technology Digest of Technical Papers*, Jun. 1998, pp. 2–5.
Smekalin et al, "A Two–Step CMP–RIE Planarization Sequence for Advanced Trench Isolation Process," *Techn. Dig., 1997 CMP–MIC Conf.*, Feb. 13–14, 1997, pp. 21–28.
Van Cleemput et al, "HDPCVD Films Enabling Shallow Trench Isolation," *Semiconductor Int'L.*, Jul. 1997, pp. 179–186.
Withers et al, "A Wide Margin CMP and Clean Process for Shallow Trench Isolation Applications," *Tech. Dig., 1998 CMP–MIC Conf.*, Feb. 19–20, 1998, pp. 319–327.

* cited by examiner

Primary Examiner—John F. Niebling
Assistant Examiner—Walter L. Lindsay, Jr.
(74) Attorney, Agent, or Firm—Skjerven Morrill MacPherson LLP; Ronald J. Meetin (57) ABSTRACT

A trenched-isolated semiconductor structure is created by a process that entails forming a patterned trench (54) along an upper surface of a semiconductor body (40). A dielectric layer (56) is provided over the upper semiconductor surface. The dielectric layer is covered with a smoothening layer (60) whose upper surface is smoother than the upper surface of the dielectric layer. The smoothening layer is removed starting from its upper surface. During the removal of the smoothening layer, upward-protruding material of the dielectric layer progressively becomes exposed and is also removed. As a result, the remainder of dielectric layer has a smoother upper surface than the initial upper surface of the dielectric layer.

41 Claims, 5 Drawing Sheets

SEMICONDUCTOR TRENCH ISOLATION PROCESS THAT UTILIZES SMOOTHENING LAYER

FIELD OF USE

This invention relates to semiconductor technology and, in particular, to trenched structures for isolating active regions in semiconductor devices.

BACKGROUND

For an electronic device created from a semiconductor body to operate efficiently, active regions in the semiconductor body normally have to be laterally electrically isolated from another along a surface of the body. A variety of techniques have been investigated for laterally isolating active semiconductor regions. One highly promising isolation technique is shallow trench isolation ("STI") in which a shallow patterned trench filled with dielectric material is provided along a surface of a semiconductor body. A portion of the trench laterally surrounds each active semiconductor region. STI is advantageous because it permits the lateral device density, i.e., the density of transistors and other electronic elements present along the surface of the trench-isolated semiconductor body, to be quite high.

FIGS. 1a–1e illustrate how STI is conventionally provided in a monocrystalline silicon semiconductor substrate 20. A thin silicon-oxide layer 22 is provided along the upper surface of substrate 20. See FIG. 1a. A considerably thicker silicon-nitride layer 24 is deposited on oxide layer 22.

Figure 1A:
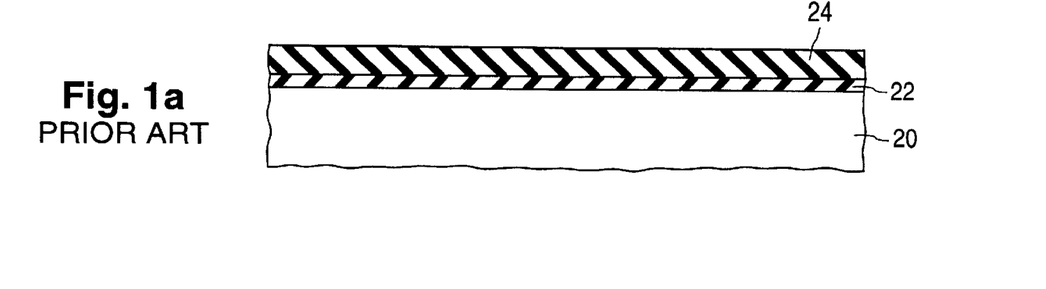
FIGS. 1a–1e are cross-sectional side views representing steps in manufacturing a trench-isolated structure according to a conventional STI process.
Figure 1B:
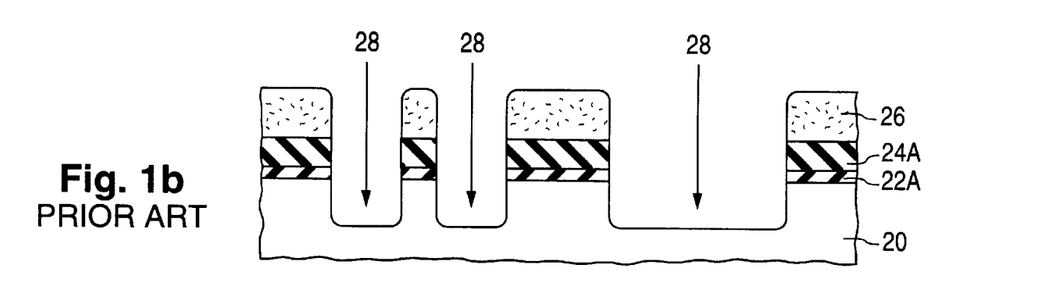
Figure 1C:
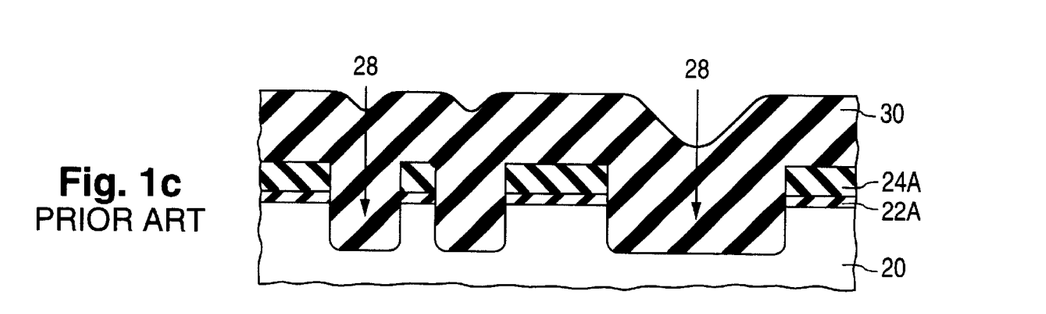

Referring to FIG. 1b, a photoresist mask 26 is formed on nitride layer 24. The exposed material of nitride 24 and the underlying material of oxide 22 are removed as indicated in FIG. 1b. Items 22A and 24A in FIG. 1b respectively indicate the remainders of oxide 22 and nitride 24. The exposed silicon is etched to form a shallow patterned trench 28 in substrate 20. A dielectric layer 30, normally consisting of oxide, is deposited on top of the structure and into trench 28 to an average thickness sufficient to fill trench 28. See FIG. 1c. The upper surface of dielectric 30 has depressions, whose depth varies from point to point, above trench 28.

Figure 1D:
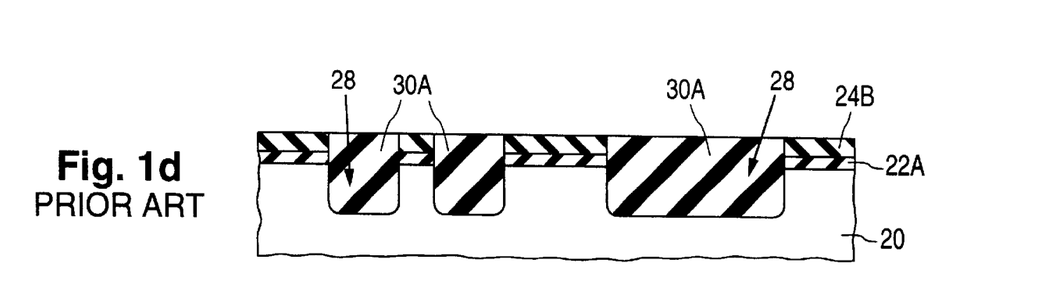

A chemical-mechanical polishing ("CMP") technique is utilized to remove the portions of dielectric layer 30 situated above nitride 24A. A portion of the thickness of nitride 24A is also removed during the CMP operation. FIG. 1d illustrates how the structure ideally appears after the CMP operation. Dielectric material 30A, the remainder of dielectric 30, fills trench 28. Item 24B in FIG. 1d is the thinned remainder of nitride 24A.

Figure 1E:
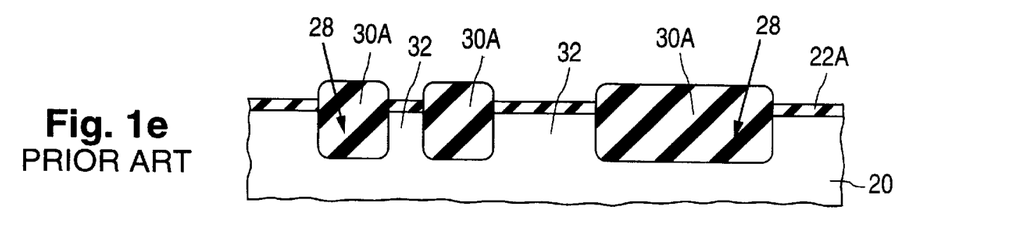

Remaining nitride 24B is removed to produce the ideal trench-isolated structure shown in FIG. 1e. Items 32 in FIG. 1e indicate trench-isolated active regions of substrate 20. Inasmuch as the sidewalls of trench 28 are nearly vertical, the device density can be very high. Also, the upper surface of the trench-isolated structure is relatively flat, thereby facilitating subsequent manufacturing operations.

Figure 2A:
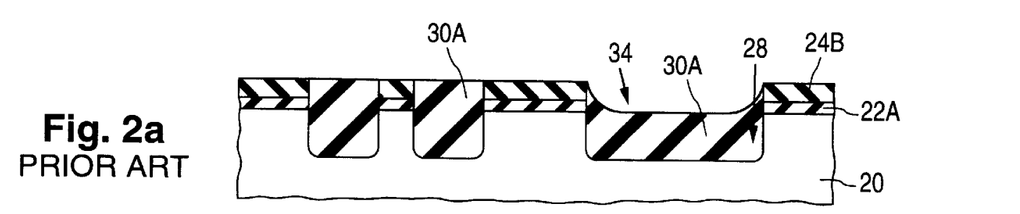
FIGS. 2a and 2b are cross-sectional side views hat correspond to the views of FIGS. 1d and 1e for illustrating dishing.
Figure 2B:
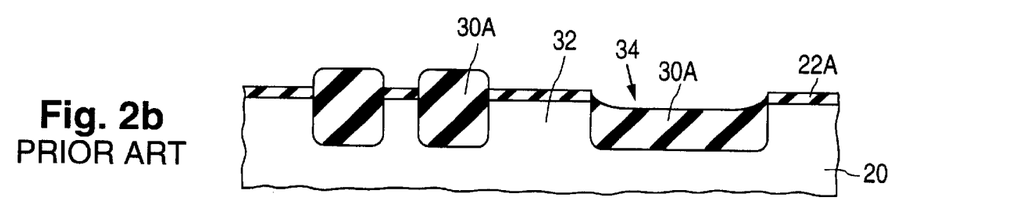

In actual practice, it is difficult to achieve the ideal trench-isolated structure shown in FIG. 1e. Various deviations from ideality arise, largely due to the inability to compensate, during the CMP operation, for variations in the lateral width of trench 28 and for variations in the spacing between portions of trench 28. These variations arise from the pattern of the circuitry being created and are referred to here as pattern density variations. FIGS. 2a and 2b illustrate one of the conventional difficulties caused by pattern density variations, while FIGS. 3a and 3b illustrate another of the conventional difficulties caused by pattern density variations.

FIG. 2a depicts how part of the trench-isolated structure often actually appears at the stage of FIG. 1d directly after the CMP operation. FIG. 2b depicts how that part of the trench-isolated structure often actually appears at the stage of FIG. 1e after the removal of nitride 24B. Item 34 in FIGS. 2a and 2b indicates a region where dielectric-filled trench 28 is relatively wide in both lateral directions and, consequently, where the depression in dielectric layer 30 is relatively deep at the stage of FIG. 1c. Although the CMP operation serves to provide trench dielectric region 30A with a moderately flat upper surface, the CMP operation often cannot fully compensate for the greater depression depth at region 34. Consequently, trench dielectric region 30A has a depression at region 34. This phenomenon, commonly termed "dishing", is disadvantageous because it degrades the upper surface planarity.

Figure 3A:
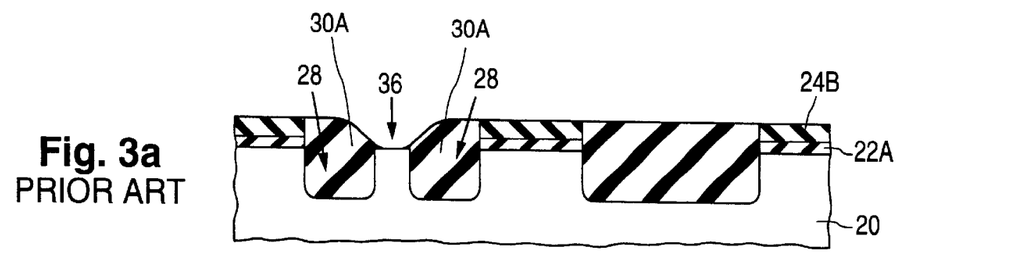
FIGS. 3a and 3b are cross-sectional side views that correspond to FIGS. 1d and 1e for illustrating premature silicon-nitride removal.
Figure 3B:
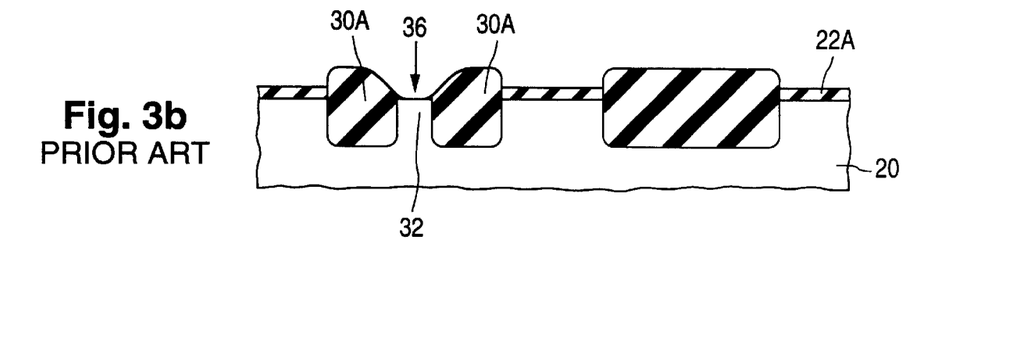

FIGS. 3a and 3b similarly respectively depict how part of the trench-isolated structure often actually appears at the stages of FIGS. 1d and 1e. Item 36 in FIGS. 3a and 3b indicates a region where portions of trench 28 are quite close to each other and are relatively wide in the lateral direction perpendicular to the sidewalls of region 36. Due to this geometry at region 36, the portion of nitride 24A at region 36, and the underlying portion of oxide 22A, are often removed during the CMP operation. The underlying silicon becomes exposed during the CMP operation and is often damaged, leading to performance loss.

Various measures have been utilized to overcome the dishing and premature nitride removal problems that result from pattern density variations. These measures include (a) providing dummy active regions in areas where trench 28 would otherwise be quite wide in both lateral directions, (b) performing additional etching to remove certain parts of dielectric 30 before performing the CMP operation, and (c) implementing the CMP operation with a slurry that has high oxide-to-nitride etch selectivity. See (a) Grillaert et al, "A novel approach for the elimination of the pattern density dependence of CMP for shallow trench isolation," Tech. Dig., 1998 CMP-MIC Conf., Feb. 19–20, 1998, pages 313–318, (b) Withers et al, "A Wide Margin CMP and Clean Process for Shallow Trench Isolation Applications," Tech. Dig., 1998 CMP-MIC Conf., Feb. 19–20, 1998, pages 319–327, (c) Hosali et al, "Planarization Process and Consumable Development for Shallow Trench Isolation," Tech. Dig., 1997 CMP-MIC Conf., Feb. 13–14, 1997, pages 52–57, (d) Mills et al, "Raising Oxide:Nitride Selectivity to Aid in the CMP of Shallow Trench Isolation Type Applications," Tech. Dig., 1997 CMP-MIC Conf., Feb. 13–14, 1997, pages 179–185, and (e) Detzel et al, "Comparison of the Performance of Slurries for STI Processing," Tech. Dig., 1997 CMP-MIC Conf., Feb. 13–14, 1997, pages 202–206.

The preceding measures achieve varying degrees of success in compensating for pattern density variations and overcoming problems such as dishing and premature nitride removal. Unfortunately, these measures increase the process complexity considerably. Some of them require special computer algorithms for creating masks used in additional lithographic steps. The cost of STI is increased substantially. It is desirable to implement an STI process in a simple, low-cost manner in which the sensitivity to pattern density variations very small.

GENERAL DISCLOSURE OF THE INVENTION

The present invention furnishes such an implementation of the shallow trench isolation process. In the invention, a pre-smoothening technique is employed to overcome difficulties that might otherwise arise due to pattern density variations. Use of the present pre-smoothening technique results in a fully adequate trench-isolated structure without significantly increasing process complexity, and thus without significantly increasing fabrication costs.

More particularly, in accordance with the invention, a patterned trench is formed in a semiconductor body along its upper surface. The sidewalls of the trench are normally roughly vertical. A dielectric layer having a rough upper surface is provided in the trench and over the semiconductor material outside the trench.

The dielectric layer is covered with a smoothening layer whose upper surface is smoother than the rough upper surface of the dielectric layer. The smoothening layer is typically formed with material, such as spinon glass or borophosphosilicate glass, that can be readily provided with a largely planar upper surface. For example, after furnishing suitable smoothening material over the dielectric layer, the semiconductor body and overlying material can be spun to create the smoothening layer from the smoothening material. The spinning operation can be initiated before the smoothening material is provided over the dielectric layer. Also, the smoothening material can be heated to cause it to flow and thereby smoothen its upper surface.

Starting largely from the upper surface of the smoothening layer and going downward, the smoothening layer is progressively removed. As the smoothening layer is being removed, material of the dielectric layer becomes progressively exposed and is likewise removed. The removal operation is normally continued until largely all of the material of the dielectric layer to the sides of the trench is removed. At the end of the removal operation, part of the dielectric layer remains and has a smoother upper surface than the initial rough surface of the dielectric layer. In effect, the relatively smooth upper surface of the smoothening layer is transferred to the remainder of the dielectric layer.

Chemical-mechanical polishing is typically employed in removing the smoothening layer and the resulting exposed material of the dielectric layer. The removal operation is normally performed in such a way that the rate $dz_S/dt$ of removing the material of the smoothening layer is moderately close to the rate $dz_D/dt$ of removing material of the dielectric layer. The ratio $R_{S/D}$ of the smoothening-material removal rate $dz_S/dt$ to the dielectric-material removal rate $dz_D/dt$ normally ranges from 0.2 to 5, preferably from 0.5 to 2. By performing the removal operation in this manner, the upper surface of the remainder of the dielectric layer is normally quite flat. Dishing is largely avoided.

Returning to the process stage at which the trench is created, the trench is normally formed by etching the semiconductor body through a opening in a mask provided over the semiconductor body. The dielectric layer is then provided over a specified region of the mask. The specified mask region is preferably formed primarily with silicon nitride.

During the removal step, the material of the smoothening and dielectric layers overlying the specified mask region is removed. Part of the specified mask region is also normally removed during the removal step. However, due to the use of the smoothening layer, the entire thickness of the specified mask region is normally not removed at any location during the removal step. In particular, complete removal of the material of the specified mask region is avoided at locations where portions of the trench are close to one another and are relatively wide in the lateral direction perpendicular to the sidewalls of the intervening portion of the semiconductor body. The invention thereby overcomes the premature silicon-nitride removal difficulty and attendant damage to the underlying semiconductor material that commonly occurs in the prior art.

The STI process of the invention is relatively simple. Very little, essentially no, sensitivity to pattern density variations arises in the present STI process. There is no need for highly selective, and potentially very expensive, etchant slurries during chemical-mechanical polishing. Nor is there any need to provide dummy active regions which compensate for pattern density variations but which complicate the device layout design, increase the mask cost, and limit the design flexibity. In short, the present STI process yields an excellent trench-isolated structure at a comparatively low fabrication cost. The invention thus provides a large advance over the prior art.

BRIEF DESCRIPTION OF THE DRAWINGS

Like reference symbols are employed in the drawings and in the description of the preferred embodiments to represent the same, or very similar, item or items.

DESCRIPTION OF THE PREFERRED EMBODIMENTS

FIGS. 4a–4g (collectively "FIG. 4") illustrate a process that follows the invention's teachings for manufacturing an STI structure using a pre-smoothening technique to avoid difficulties such as dishing and premature silicon-nitride removal that might otherwise occur during chemical-mechanical polishing (again "CMP") as a result of pattern density variations. The trench-isolated structure created according to the process of FIG. 4 is normally further processed to create one or more semiconductor die having desired electronic circuitry.

Figure 4A:
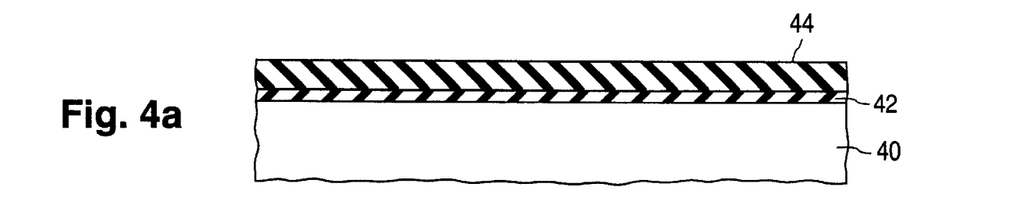
FIGS. 4a–4g are cross-sectional side views representing steps in manufacturing a trench-isolated structure according to an STI process that utilizes a pre-smoothening technique in accordance with the invention.

The starting point for the process of FIG. 4 is a monocrystalline silicon semiconductor body 40 as shown in FIG. 4a. Semiconductor body 40, which may be of p-type or n-type conductivity or may have regions of both p-type and n-type conductivity, is typically a wafer having a largely planar upper surface. A thin blanket pad layer 42 of silicon oxide is thermally grown along the upper surface of semiconductor body 40 to an average thickness of 6–20 nm, typically 8–12 nm. Pad oxide layer 42 relieves stress along the upper silicon surface and thereby protects the underlying silicon from being damaged during subsequent manufacturing operations.

A blanket layer 44 of masking material is deposited on top of oxide layer 42 to an average thickness considerably greater than the average thickness of oxide layer 42. The silicon in semiconductor body 40 and the masking material in mask layer 44 are selectively etchable with respect to each other. Mask layer 44 typically consists of silicon nitride having a thickness of 50–400 nm, typically 100–300 nm. Alternatively, mask layer 44 can be formed with silicon oxynitride.

A photoresist mask 46 is formed on top of mask layer 44. See FIG. 4*b*. Photoresist mask 46 has a mask opening 48 above the intended location for a patterned trench in semiconductor body 40. The multiple portions of mask opening 48 illustrated in FIG. 4*b* connect to one another outside the plane of the figure.

The portions of mask layer 44 exposed through photoresist mask opening 48 are removed with a largely anisotropic etchant, typically a plasma etchant, to form a further mask opening 50 through mask layer 44. Items 44A in FIG. 4*b* indicate the remaining portions of mask layer 44. Photoresist mask 46 can be removed at this point but typically remains in place. In either case, the portion of pad oxide layer 42 exposed through further mask opening 50 is removed with a largely anisostropic etchant, again typically a plasma etchant, to form an opening 52 through oxide layer 42. When photoresist 46 is present, the etch of oxide 42 is also performed through mask opening 48. Photoresist 46 normally left in place during the oxide etch when the etchant used to form opening 52 also significantly attacks remaining mask portions 44A. Items 42A in FIG. 4*b* indicate the remaining portions of pad oxide 42.

Figure 4B:
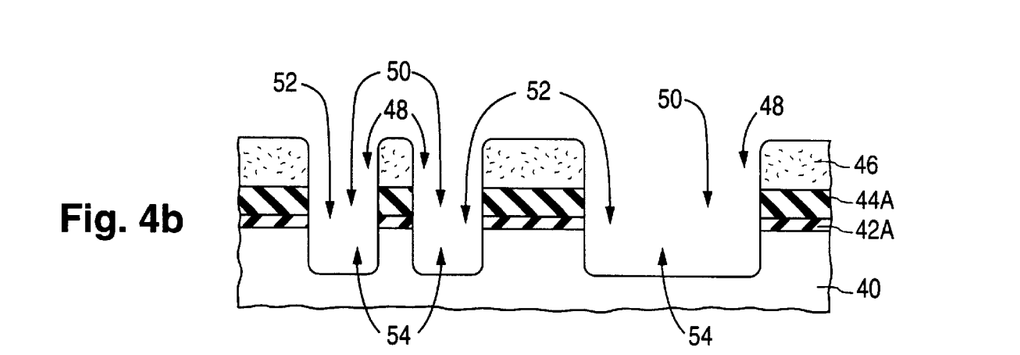

Photoresist 46 can be removed after etching oxide 42 to form oxide portions 52 but typically remains in place. In any event, oxide portions 42A and mask portions 44A, again typically silicon nitride, are now components of a composite mask. When photoresist 46 is left in place, the composite mask includes photoresist 46. The composite mask has a composite mask opening formed with openings 52 and 50 and, when photoresist 46 is present, opening 48.

A portion of the silicon of semiconductor body 40 is exposed through composite mask opening 48/50/52. A largely anisotropic etch is performed through composite opening 48/50/52 on the exposed silicon to form a shallow patterned trench 54 in body 40. Since the etch is largely anisotropic, the sidewalls of trench 54 are approximately vertical. The etchant is typically a plasma formed with hydrogen bromide and carbon tetrafluoride. The anisotropic etch can alternatively be performed with etchant such as a chlorine-based plasma. Photoresist 46 is typically left in place during the silicon etch when the etchant used to form silicon trench 54 also significantly attacks mask portions 44A.

Within the ambit of being approximately vertical, the sidewalls of trench 54 may, on the average, slant slightly inward or outward. For example, the trench sidewalls may slant up to 10° inward or outward. The sidewall slant is typically 4–6°. The width measured laterally, of trench 54 depends on the function to be performed by the semiconductor device being created from body 40 and typically varies from place to place. The average depth of trench 54 is 200–600 nm, typically 300–500 nm.

If not removed early, photoresist mask 46 is now removed. Mask portions 44A and pad oxide portions 42A remain in place. Openings 50 and 52 and trench 54 now form a composite trench along the upper surface of the structure.

Figure 4C:
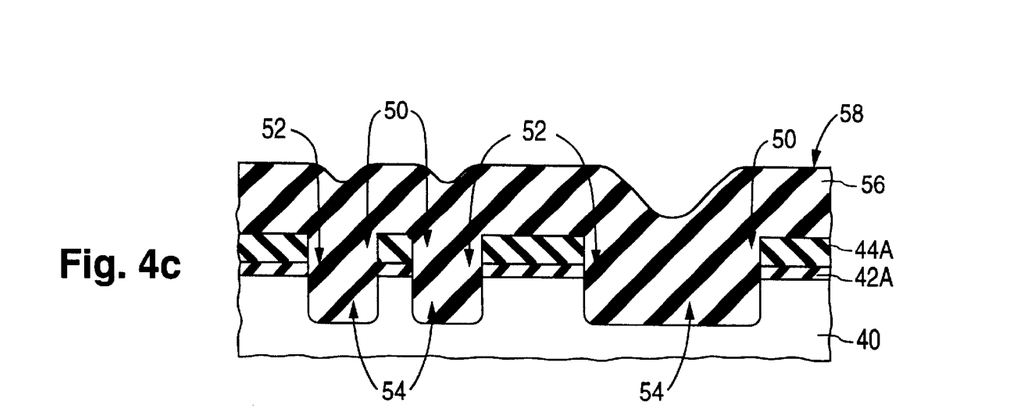

A layer 56 of dielectric material is deposited on mask portions 44A and through openings 50 and 52 into trench 54 to an average thickness sufficient to completely fill composite trench 50/52/54 as shown in FIG. 4*c*. When pad oxide layer 42, mask layer 44, and trench 54 have the abovementioned vertical dimensions, the average thickness of dielectric layer 56 is 400–800 nm, typically 500–700 nm. Dielectric layer 56 roughly conforms to the upper surface of the underlying material. Consequently, layer 56 has an upper surface, indicated by reference symbol 58, that is rough compared to the upper surface of semiconductor body 40 or mask layer 44 prior to the formation of opening 50 and trench 54. Upper dielectric surface 58 has a depression above trench 54. This depression varies in depth from point to point as indicated in FIG. 4*c*.

Dielectric layer 56 typically consists primarily of silicon oxide deposited by a plasma chemical vapor deposition ("PCVD") technique to be of high density. Cleemput et al, "HDPCVD Films Enabling Shallow Trench Isolation," *Semiconductor International*, July 1997, pages 179, 180, 182, 184, and 186, describe a technique for creating high-density PCVD oxide suitable for layer 56. Alternatively, layer 56 may consist of tetraethylorthosilicate, often referred to as TEOS.

Figure 4D:
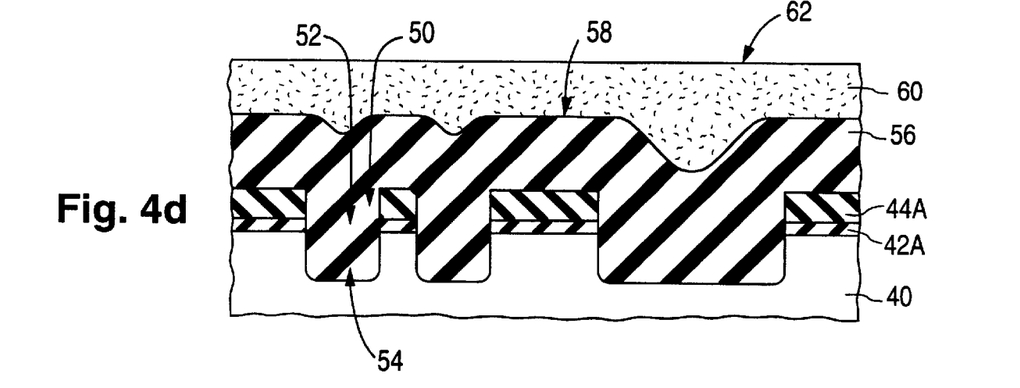

Dielectric layer 56 is now covered with a layer 60 of smoothening material as shown in FIG. 4*d*. Smoothening layer 60 is of average thickness sufficiently great that layer 60 completely fills the depressed portion of upper dielectric surface 58 above trench 54. The average thickness of layer 60 is 300–700 nm, typically 400–600 nm.

Importantly, smoothening layer 60 has an upper surface 62 which is considerably smoother than upper dielectric surface 58. Ideally, upper smoothening surface 62 is largely planar. In actuality, there may be slight depressions in upper smoothening surface 62 at the locations of the deepest parts of the depressed portion of upper dielectric surface 58. Compared to upper dielectric surface 58, upper smoothening surface 62 is largely planar.

Smoothening layer 60 can be formed with various materials provided that, in subsequent processing steps, the smoothening material can be removed at a suitable rate as described further below. For example, the smoothening material can be electrically insulating, semiconductive, or/and electrically conductive. Smoothening layer 60 may consist largely of material of one chemical type or of regions, e.g., layers, of material of multiple chemical types. Layer 60 include typically consists largely of material generally known as spin-on glass. Alternative candidates for layer 60 include borophosphosilicate glass, phosphosilicate glass, and potentially borosilicate glass. Layer 60 may contain two or more of these materials, including spin-on glass.

Figure 5:
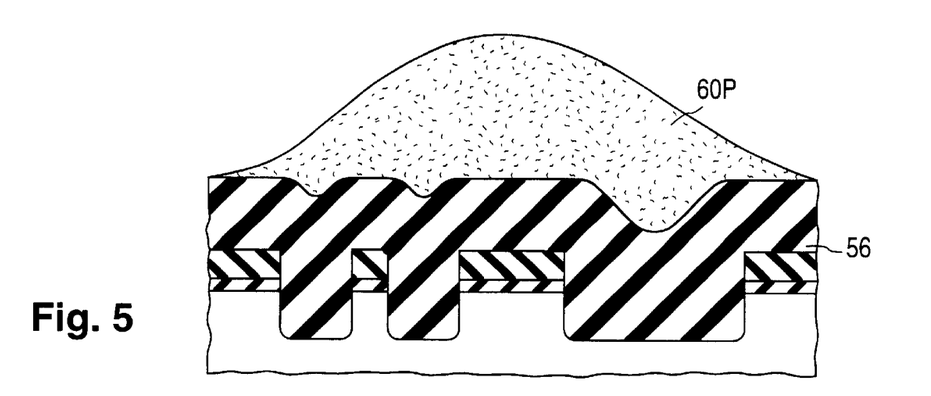
FIG. 5 is a cross-sectional side view of how the smoothening material of FIG. 4d appears before the smoothening material is provided with a relatively flat upper surface.

Smoothening layer 60 can be formed in various ways. For example, layer 60 can be created by a deposition/spinning procedure. Referring to FIG. 5, a precursor portion 60P of the smoothening material can be deposited on dielectric layer 56. The smoothing material can be deposited as a single layer or as multiple layers. In either case, the resulting structure is spun about an axis largely perpendicular to the upper surface of semiconductor body 40 to flatten out precursor portion 60P and convert it into layer 60. One or more post-spinning operations, such as an elevated-temperature curing step, are normally employed to complete the formation of layer 60. The elevated temperature cure may be performed in a vacuum.

Alternatively, deposition of a precursor portion of the smoothening material on dielectric layer 56 can be performed while the structure shown in FIG. 4*c* is being spun about an axis largely perpendicular to the upper semiconductor surface. The spinning is typically initiated before depositing the smoothening material but can be initiated at the same time as the smoothening material deposition. In either case, the spinning is continued for a sufficient time after the smoothening material deposition to flatten the upper surface of the deposited smoothening material and convert it into smoothening layer 60. A post-smoothening operation, such as an elevated-temperature curing step, is again typically employed to complete the smoothening layer formation. Again, the elevated-temperature cure may be done in a vacuum. A deposition/spinning process is particularly appropriate for creating layer 60 when it consists of spin-on glass.

As another alternative, a deposition/flow procedure can be employed to form smoothening layer 60. Precursor smoothening portion 60P is again deposited on dielectric layer 56 as roughly indicated in FIG. 5. The resultant structure is heated to a temperature sufficiently high to cause precursor portion 60P to soften and flow without causing significant softening of any of the other material in the structure. The heating operation is performed for a time adequate to flatten out portion 60P, again converting it into layer 60. A deposition/flow procedure is suitable when layer 60 consists of borophosphosilicate glass, phosphosilicate glass, and potentially borosilicate glass. A deposition/flow procedure can also be used when layer 60 consists of spin-on glass.

Furthermore, a deposition/flow procedure can be combined with a deposition/spinning procedure to form smoothening layer 60. In particular, a deposition/spinning procedure is performed in any of the ways described above so as to provide the deposited smoothening material with a moderately flat upper surface. A heating operation is then conducted as generally described in the previous paragraph to further flatten the upper surface of the deposited smoothening material and convert it into layer 60. Inasmuch as the upper surface of the deposited smoothening material is normally relatively flat at the end of the spinning operation, the heating step may be performed to a somewhat lesser extent i.e., for a shorter time or/and at a lower temperature, than when spinning is not employed.

Chemical-mechanical polishing with a polishing mechanism and an etching slurry is performed to remove smoothening layer 62 in a largely uniform manner starting from upper smoothening surface 62 and moving downward into layer 60. As the smoothening material is removed, portions of dielectric layer 56 are progressively exposed. The CMP operation is continued into layer 56 to remove dielectric material at locations where portions of layer 56 are exposed, and then into mask portions 44A at the locations where all the overlying smoothening and dielectric material has been removed.

By appropriately choosing the characteristics for the composition of the CMP slurry and the chemical compositions of dielectric layer 56 and smoothening layer 60, the average rate $dz_S/dt$ of removing material of smoothening layer 60 during the CMP operation is moderately close, typically relative close, to the average rate $dz_D/dt$ of removing the material of dielectric layer 56 during the CMP operation. More particularly, the ratio $R_{S/D}$ of smoothening-material removal rate $dz_S/dt$ to dielectric-material removal rate $dz_D/dt$ is normally 0.2–5. Smoothening-to-dielectric removal ratio $R_{S/D}$ is preferably 0.5–2, more preferably 1.

Figure 4E:
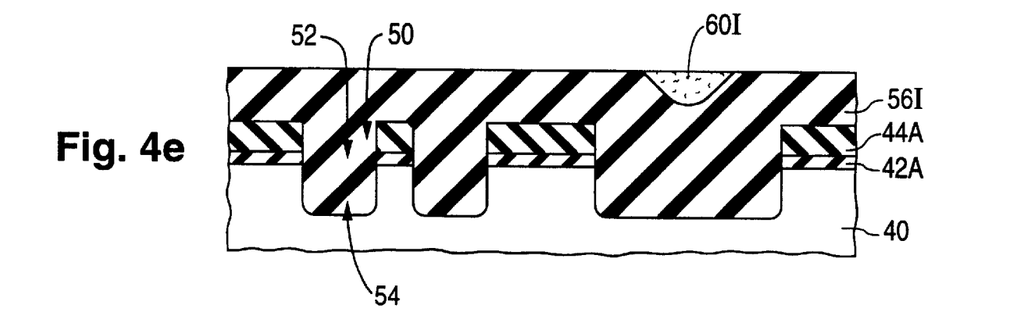

FIG. 4e depicts how the structure appears at an intermediate point in the CMP operation. Specifically, FIG. 4e illustrates the appearance of the structure after the removal of most, but not all, of smoothening layer 60. Item 60I in FIG. 4e indicates a portion of layer 60 situated at a low point along original upper dielectric surface 58. Item 56I is the remainder of dielectric layer 56 at the intermediate point.

With smoothening-material removal rate $dz_S/dt$ being moderately close, typically relatively close, to dielectric-material removal rate $dz_D/dt$, the composite thickness of the removed smoothening and dielectric material is moderately uniform, typically relatively uniform, across the structure up to the point at which mask portions 44A start to become exposed. As a result, intermediate dielectric portion 56I and intermediate masking portion 60I have a composite intermediate surface that is moderately flat, typically relatively flat, preferably largely planar. In effect, upper smoothening surface 62 is translated downward. Also, mask portions 44A become exposed at largely the same time.

Figure 4F:
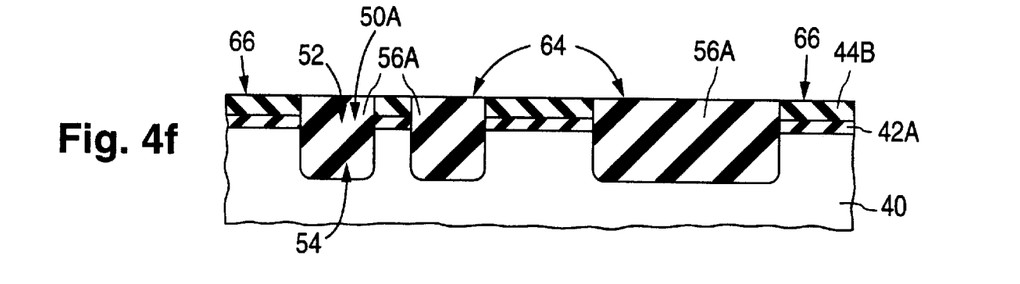

The CMP operation is terminated when a portion of the thickness of mask portions 44A has been removed. See FIG. 4f in which items 44B are the remaining parts of mask portions 44A, and item 50A is the remainder of mask opening 50. Mask opening 50A, dielectric opening 52, and trench 54 now form a composite trench. Item 56A in FIG. 4f is the remainder of dielectric layer 56. Remaining dielectric portion 56A is a patterned trench-dielectric isolation region that occupies composite trench 50A/52/54.

Trench-dielectric isolation region 56A has an upper surface 64 that is relatively flat, typically largely planar. This arises because (a) original upper smoothening surface 62 was very flat and (b) smoothening-material removal rate $dz_S/dt$ was moderately close, typically relatively close, to dielectric-material removal rate $dz_D/dt$ so that the composite thickness of the removed smoothening and dielectric material above trench 54 is moderately uniform, typically relatively uniform, across the structure. Very little, if any, dishing occurs during the CMP operation. No significant depressions are present in the portions of upper trench-dielectric surface 64 where trench dielectric region 56A is wide in both lateral directions.

Also, remaining mask parts 44B have upper surfaces 66 that are relatively flat, likewise typically largely planar, and lie in approximately the same plane. This similarly arises because (a) original upper smoothening surface 62 was very flat and (b) smoothening-material removal rate $dz_S/dt$ was moderately close, typically relatively close, to dielectric-material removal rate $dz_D/dt$ so that the composite thickness of the removed smoothening, dielectric, and masking material to the sides of composite trench 50A/52/54 is moderately uniform, typically relatively uniform, across the structure. The thickness of mask parts 44B is relatively uniform across the structure, including the locations where portions of dielectric isolation region 56A are close to each other. The complete thickness of mask parts 44B, once again typically silicon nitride, is normally not removed at any location during the CMP operation. Premature silicon-nitride removal is largely avoided in the process of FIG. 4.

The average rate $dz_M/dt$ of removing the material of mask layer 44 during the CMP operation is normally not greatly different from dielectric-material removal rate $dz_D/dt$ during the CMP operation. In particular, the ratio $R_{M/D}$ of masking-material removal rate $dz_M/dt$ to dielectric-material removal rate $dz_D/dt$ is normally 0.5–1, typically 1. In addition to being largely parallel to upper dielectric surface 64, upper mask surfaces 66 are moderately close to upper dielectric surface 64 height-wise. FIG. 4f illustrates an example in which upper dielectric surface 64 is slightly lower than upper mask surfaces 66. This example arises when maskingto-dielectric removal ratio $R_{M/D}$ is slightly less than than 1. Masking-to-dielectric removal ratio $R_{M/D}$ can be considerably less than 1, e.g., down to 0.01 or less. Consequently, masking-to-dielectric removal ratio $R_{M/D}$ can readily vary from 1 to 0.01 or less. Alternatively, upper dielectric surface 64 can be made slightly higher than upper mask surfaces 66 by setting ratio $R_{M/D}$ at a value above 1.

Figure 4G:
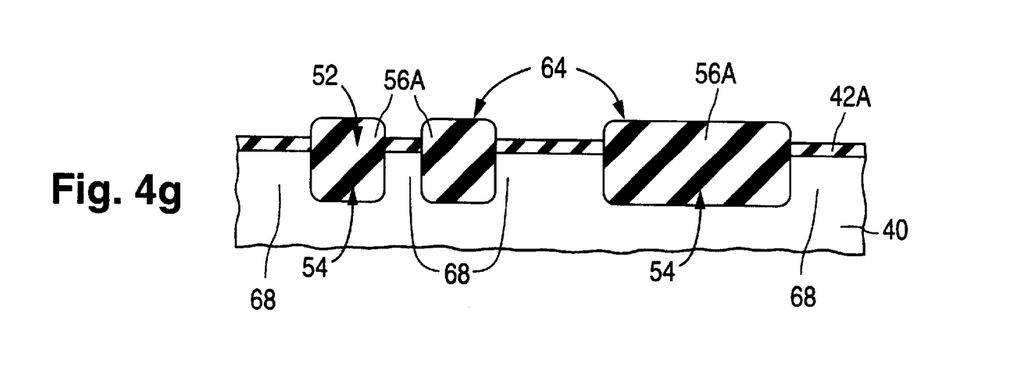

The basic trench-isolated structure is completed by removing mask parts 44B with etchant that does not significantly attack the material of pad oxide portions 42A. FIG. 4g illustrates the resultant structure. The etchant used to remove mask parts 44B is typically a (wet) chemical etchant. Items 68 in FIG. 4g are the resultant trench-isolated active semiconductor regions of semiconductor body 40. In subsequent operations, the trench-isolated structure of FIG. 4f is processed to create electronic semiconductor elements such as transistors and resistors according to the desired circuit design.

The process of FIG. 4 can be modified in various ways according to the invention.

Figure 6A:
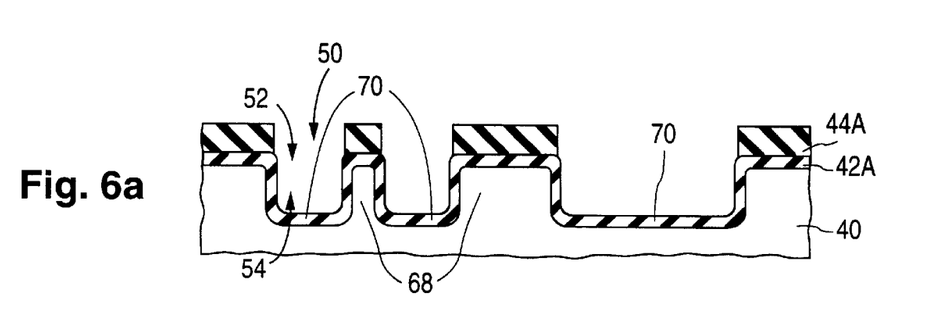
FIGS. 6a and 6b are cross-sectional side views representing steps which, in accordance with the invention, can be substituted for the steps represented by FIGS. 4b and 4c.
Figure 6B:
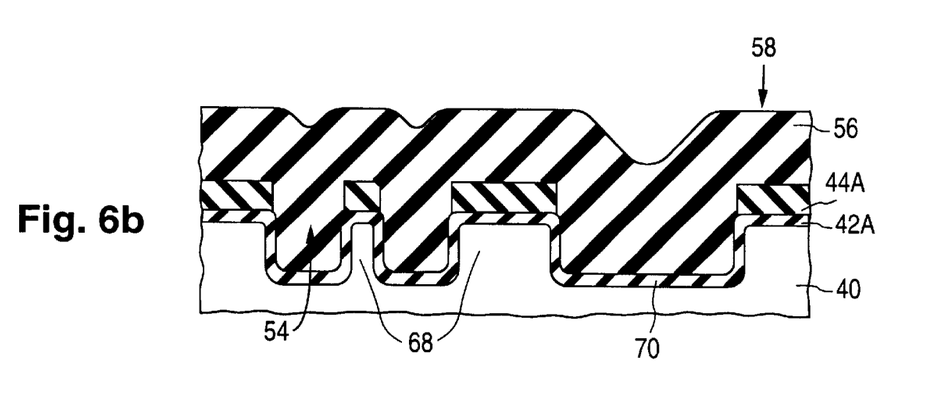

FIGS. 6a and 6b illustrate a liner-dielectric variation. Starting from the structure of FIG. 4a, a liner dielectric layer 70 is provided along trench 54 prior to the trench-filling operation. See FIG. 6a. Liner dielectric layer 70 is typically grown by exposing trench 54 to an oxidizing atmosphere such as oxygen, for 60–120 min., typically 90 min., at 800–1100° C., typically 1050° C. Creating liner dielectric layer 68 causes the corners of active regions 68 to become rounded (or more rounded), thereby avoiding high electric fields that could otherwise occur at sharp corners of active regions 68.

Dielectric layer 56 is then deposited on mask portions 44A and through openings 50 and 52 into trench 54 as shown in FIG. 6b. The only significant difference between this variation and the process of FIG. 4 is that layer 56 contacts liner dielectric layer 70 in this variation rather than contacting semiconductor body 40 as occurs in the process of FIG. 4. Further processing of the structure of FIG. 6b is conducted in the way described above for the structure of FIG. 4d.

In another variation of the process of FIG. 4, the formation of dielectric layer 56 includes performing a densification step after the trench dielectric material is deposited on mask portions 44A and into composite trench 50/52/54. The densification step is performed by heating the structure for 25–40 min., typically 30 min., at 900–1050° C., typically 1000° C. The trench dielectric densification eliminates any substantial voids that may be present in dielectric layer 56 and serves to prevent film delamination, cracking, and irregular surface etching during subsequent fabrication steps. This variation can be combined with the liner-dielectric variation.

While the invention has been described with reference to particular embodiments, this description is solely for the purpose of illustration and is not to be construed as limiting the scope of the invention claimed below. For example, semiconductor body 40 can consist of semiconductor material other than silicon. Examples include germanium and gallium arsenide. Body 40 can also consist of multiple types of semiconductor material such as a composite of silicon and germanium. Body 40 can overlie an electrically insulating substrate to create a semiconductor-on-insulator structure. Various modifications and applications may thus be made by those skilled in the art without departing from the true scope and spirit of the invention as defined in the appended claims.

I claim:

1. A method comprising the steps of:
    forming a patterned trench in a semiconductor body along its upper surface;
    depositing a dielectric layer into the trench and over material of the semiconductor body outside the trench such that the dielectric layer largely fills the trench and has an initial rough upper surface;
    largely covering the dielectric layer with a smoothening layer having an upper surface smoother than the initial rough upper surface of the dielectric layer, the covering step comprising (a) furnishing material of the smoothening layer over the dielectric layer and (b) heating the so-furnished material to cause it to flow and thereby smoothen its upper surface; and
    removing, starting largely from the upper surface of the smoothening layer and going generally downward, the smoothening layer and resulting exposed material of the dielectric layer such that part of the dielectric layer remains and has an upper surface smoother than the initial rough upper surface of the dielectric layer, the ratio $R_{S/D}$ of the average rate $dz_S/dt$ of so removing material of the smoothening layer to the average rate $dz_D/dt$ of so removing material of the dielectric layer being 0.2–5.

2. A method as in claim 1 wherein ratio $R_{S/D}$ is 0.5–2.

3. A method as in claim 1 wherein the removing step is performed, at least partly, according to a chemical-mechanical polishing technique.

4. A method as in claim 1 wherein the trench has roughly vertical sidewalls.

5. A method as in claim 1 wherein the trench forming step comprises:
    providing, over the semiconductor body, a mask having a mask opening; and
    etching the semiconductor body through the mask opening to form the trench.

6. A method as in claim 5 wherein the dielectric-layer depositing step entails depositing the dielectric layer over a specified mask region of the mask.

7. A method as in claim 6 wherein largely all material of the smoothening and dielectric layers overlying the specified mask region is removed during the removing step.

8. A method as in claim 6 wherein the removing step entails removing part of the specified mask region without removing a full thickness portion of the specified mask region at any location.

9. A method as in claim 8 wherein the ratio $R_{M/D}$ of the average rate $dz_M/dt$ of removing material of the specified mask region during the removing step to the average rate $dz_D/dt$ of removing material of the dielectric layer during the removing step is 0.01–1.

10. A method as in claim 9 wherein the ratio $R_{M/D}$ is 0.5–1.

11. A method as in claim 8 further including, subsequent to the removing step, the step of substantially removing the remainder of the specified mask region.

12. A method as in claim 6 wherein the specified mask region comprises silicon nitride or/and silicon oxynitride.

13. A method as in claim 12 wherein the smoothening layer comprises one or more of spin-on glass, borophosphosilicate glass, phosphosilicate glass, and borosilicate glass.

14. A method as in claim 1 wherein the smoothening layer comprises one or more of spin-on glass, borophosphosilicate glass, phosphosilicate glass, and borosilicate glass.

15. A method as in claim 1 wherein the covering step includes, before the heating step, the step of spinning the semiconductor body and overlying material about an axis generally perpendicular to the semiconductor body's upper surface so as to smoothen the upper surface of the so-furnished material of the smoothening layer.

16. A method as in claim 15 wherein the smoothening layer comprises spin-on glass.

17. A method as in claim 15 wherein the material-furnishing step is performed before the spinning step.

18. A method as in claim 15 wherein the material-furnishing step is performed at least partially during the spinning step and is completed before completing the spinning step.

19. A method as in claim 1 further including, before the dielectric-layer depositing step, the step of oxidizing semiconductor material along the trench.

20. A method as in claim 1 further including, subsequent to the dielectric-layer depositing step, the step of heating the so-deposited material to increase its density.

21. A method comprising the steps of:
forming a patterned trench in a semiconductor body along its upper surface;
depositing a dielectric layer into the trench and over material of the semiconductor body outside the trench such that the dielectric layer largely fills the trench and has an initial rough upper surface;
largely covering the dielectric layer with a smoothening layer having an upper surface smoother than the initial rough upper surface of the dielectric layer, the smoothening layer comprising at least one of borophosphosilicate glass, phosphosilicate glass, and borosilicate glass; and
removing, starting largely from the upper surface of the smoothening layer and going generally downward, the smoothening layer and resulting exposed material of the dielectric layer such that part of the dielectric layer remains and has an upper surface smoother than the initial rough upper surface of the dielectric layer, the ratio $R_{S/D}$ of the average rate $dz_S/dt$ of so removing material of the smoothening layer to the average rate $dz_D/dt$ of so removing material of the dielectric layer being 0.2–5.

22. A method as in claim 21 wherein ratio $R_{S/D}$ is 0.5–2.

23. A method as in claim 21 wherein the removing step is performed, at least partly, according to a chemical-mechanical polishing technique.

24. A method as in claim 21 wherein the trench-forming step comprises:
providing, over the semiconductor body, a mask having a mask opening; and
etching the semiconductor body through the mask opening to form the trench.

25. A method as in claim 24 wherein the dielectric-layer providing step entails forming the dielectric layer over a specified mask region of the mask.

26. A method as in claim 25 wherein the specified mask region comprises silicon nitride or/and silicon oxynitride.

27. A method as in claim 21 wherein the covering step comprises:
furnishing material of the smoothening layer over the dielectric layer; and
heating the so-furnished material to cause it to flow and thereby smoothen its upper surface.

28. A method as in claim 21 further including, between the trench-forming step and the dielectric-layer depositing step, the step of oxidizing semiconductor material along the trench.

29. A method comprising the steps of:
forming a patterned trench in a semiconductor body along its upper surface according to a procedure in which the semiconductor body is etched through an opening in a mask provided over the semiconductor body, the mask having a mask region which comprises silicon nitride or/and silicon oxynitride;
oxidizing semiconductor material along the trench;
depositing a dielectric layer into the trench and over the mask region outside the trench such that the dielectric layer has an initial rough upper surface and such that the dielectric layer, including the oxidized semiconductor material along the trench, largely fills the trench;
largely covering the dielectric layer with a smoothening layer having an upper surface smoother than the initial rough upper surface of the dielectric layer; and
removing, starting largely from the upper surface of the smoothening layer and going generally downward, the smoothening layer and resulting exposed material of the dielectric layer such that part of the dielectric layer remains and has an upper surface smoother than the initial rough upper surface of the dielectric layer, the ratio $R_{S/D}$ of the average rate $dz_S/dt$ of so removing material of the smoothening layer to the average rate $dz_D/dt$ of so removing material of the dielectric layer being 0.2–5.

30. A method as in claim 29 wherein ratio $R_{S/D}$ is 0.5–2.

31. A method as in claim 29 wherein the removing step is performed, at least partly, according to a chemical-mechanical polishing technique.

32. A method as in claim 29 wherein the removing step entails removing part of the specified mask region without removing a full thickness portion of the specified mask region at any location.

33. A method as in claim 32 wherein the ratio $R_{M/D}$ of the average rate $dz_M/dt$ of removing material of the specified mask region during the removing step to the average rate $dz_D/dt$ of removing material of the dielectric layer during the removing step is 0.01–1.

34. A method as in claim 33 wherein ratio $R_{M/D}$ is 0.5–1.

35. A method as in claim 29 wherein the smoothening layer comprises at least one of spin-on glass, borophosphosilicate glass, phosphosilicate glass, and borosilicate glass.

36. A method comprising the steps of:
forming a patterned trench in a semiconductor body along its upper surface;
depositing a dielectric layer into the trench and over material of the semiconductor body outside the trench such that the dielectric layer largely fills the trench and has an initial rough upper surface;
largely covering the dielectric layer with a smoothening layer having an upper surface smoother than the initial rough upper surface of the dielectric layer, the covering step comprising (a) furnishing material of the smoothening layer over the dielectric layer (b), spinning the semiconductor body and overlying material about an axis generally perpendicular to the semiconductor body's upper surface so as to smoothen the upper surface of the so-furnished material of the smoothening layer, and (c) heating the so-furnished material of the smoothening layer to cause it to flow and thereby further smoothen its upper surface; and removing, starting largely from the upper surface of the smoothening layer and going generally downward, the smoothening layer and resulting exposed material of the dielectric layer such that part of the dielectric layer remains and has an upper surface smoother than the initial rough upper surface of the dielectric layer.

37. A method as in claim 36 wherein the smoothening layer comprises spin-on glass.

38. A method as in claim 36 wherein the material-furnishing step is performed before the spinning step.

39. A method as in claim 36 wherein the material-furnishing step is performed at least partially during the spinning step and is completed before completing the spinning step.

40. A method as in claim 36 wherein the removing step is performed, at least partly, according to a chemical-mechanical polishing technique.

41. A method as in claim 36 further including, before the dielectric-layer depositing step, the step of oxidizing semiconductor material along the trench.

* * * * *